(12) United States Patent
Kurosawa

(10) Patent No.: US 10,018,673 B2
(45) Date of Patent: Jul. 10, 2018

(54) SEMICONDUCTOR DEVICE AND CURRENT CONTROL METHOD OF SEMICONDUCTOR DEVICE

(71) Applicant: Toshiba Memory Corporation, Minato-ku (JP)

(72) Inventor: Yasuhiko Kurosawa, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 83 days.

(21) Appl. No.: 14/848,894

(22) Filed: Sep. 9, 2015

(65) Prior Publication Data

US 2016/0266199 A1 Sep. 15, 2016

Related U.S. Application Data

(60) Provisional application No. 62/132,878, filed on Mar. 13, 2015.

(51) Int. Cl.
| | | |
|---|---|---|
| *G01R 31/3187* | (2006.01) | |
| *G01R 31/317* | (2006.01) | |
| *G11C 5/14* | (2006.01) | |
| *G11C 16/30* | (2006.01) | |
| *G11C 29/02* | (2006.01) | |
| *G11C 29/42* | (2006.01) | |

(52) U.S. Cl.
CPC ........ *G01R 31/31724* (2013.01); *G11C 5/147* (2013.01); *G11C 16/30* (2013.01); *G11C 29/021* (2013.01); *G11C 29/42* (2013.01)

(58) Field of Classification Search
CPC ...................... G01R 31/31724; G01R 31/3187

USPC ........................................ 324/750.3; 714/733
See application file for complete search history.

(56) References Cited

U.S. PATENT DOCUMENTS

| 5,554,941 | A | 9/1996 | Kesel | |
|---|---|---|---|---|
| 6,857,093 | B2 | 2/2005 | Ooishi | |
| 2006/0150016 | A1* | 7/2006 | Miller | G06F 11/1441 |
| | | | | 714/25 |
| 2006/0259840 | A1* | 11/2006 | Abadeer | G01R 31/3004 |
| | | | | 714/733 |
| 2008/0100328 | A1* | 5/2008 | Dhong | G01R 31/3004 |
| | | | | 324/750.3 |
| 2012/0065919 | A1* | 3/2012 | Brown | G01R 31/31816 |
| | | | | 702/117 |

(Continued)

FOREIGN PATENT DOCUMENTS

| JP | 8-507142 A | 7/1996 |
|---|---|---|
| JP | 2008-545120 A | 12/2008 |
| JP | 5030336 B2 | 9/2012 |

*Primary Examiner* — Patrick Assouad
*Assistant Examiner* — Demetrius Pretlow
(74) *Attorney, Agent, or Firm* — Oblon, McClelland, Maier & Neustadt, L.L.P.

(57) ABSTRACT

According to one embodiment, a semiconductor device comprises an integrated circuit having a plurality of current modes different in operation current; a voltage sensor that detects a voltage in use by the integrated circuit; a BIST control circuit that generates BIST patterns different in the operation current and creates a flag indicating the success or failure of a BIST corresponding to the operation current based on the result of detecting the voltage while the integrated circuit is made to operate based on the BIST pattern; and a storing unit that stores the flag. The integrated circuit sets the current mode based on the flag.

18 Claims, 10 Drawing Sheets

(56) References Cited

U.S. PATENT DOCUMENTS

| | | | | |
|---|---|---|---|---|
| 2012/0153982 A1* | 6/2012 | Lee | ................. | G01R 31/31908 |
| | | | | 324/756.03 |
| 2013/0219235 A1* | 8/2013 | Ohba | .................... | G11C 29/12 |
| | | | | 714/718 |
| 2014/0289559 A1* | 9/2014 | Hashimoto | ............ | G11C 29/08 |
| | | | | 714/27 |
| 2016/0025808 A1* | 1/2016 | Singh | ................ | G01R 31/3177 |
| | | | | 714/733 |

* cited by examiner

SEMICONDUCTOR DEVICE AND CURRENT CONTROL METHOD OF SEMICONDUCTOR DEVICE

CROSS-REFERENCE TO RELATED APPLICATIONS

This application is based upon and claims the benefit of priority from U.S. Provisional Application No. 62/132,878, filed on Mar. 13, 2015; the entire contents of which are incorporated herein by reference.

FIELD

Embodiments described herein relate generally to a semiconductor device and a current control method of the semiconductor device.

BACKGROUND

As semiconductor devices become finer and more advanced in performance, their throughput and load of error correction increase, and thus current consumption increases. As current consumption increases, the load on the power supply increases, and if the power supply comes not to be able to bear the load, a malfunction or the like may be caused in the semiconductor device.

DETAILED DESCRIPTION

In general, according to one embodiment, a semiconductor device comprises an integrated circuit having a plurality of current modes different in operation current; a voltage sensor that detects a voltage in use by the integrated circuit; a BIST control circuit that generates BIST patterns different in the operation current and creates a flag indicating the success or failure of a BIST corresponding to the operation current based on the result of detecting the voltage while the integrated circuit is made to operate based on the BIST pattern; and a storing unit that stores the flag. The integrated circuit sets the current mode based on the flag.

The semiconductor devices according to embodiments will be described in detail below with reference to the accompanying drawings. The present invention is not limited to these embodiments. Although description will be made taking a memory device as an example of the semiconductor device in the embodiments below, the invention may be applied to an ASIC (application specific integrated circuit) incorporated in an electronic device, or the like.

First Embodiment

Figure 1:
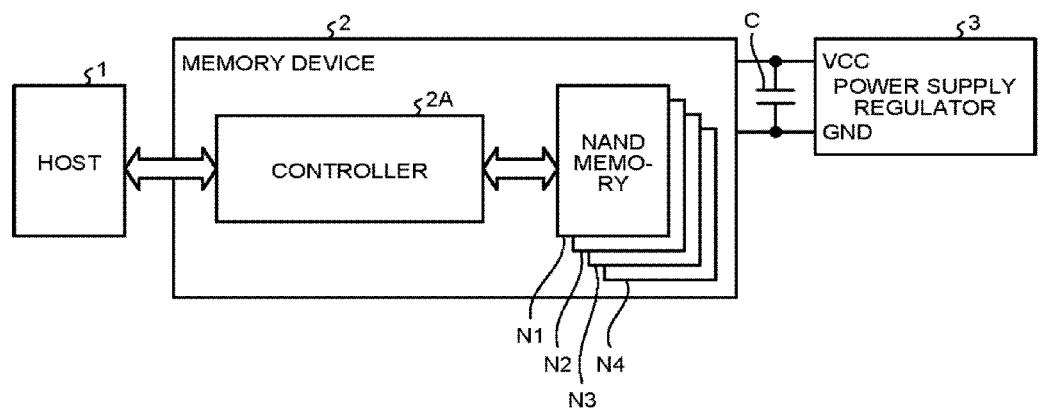
FIG. 1 is a block diagram showing a system configuration to which a semiconductor device according to a first embodiment is applied.

FIG. 1 is a block diagram showing a system configuration to which a semiconductor device according to the first embodiment is applied.

In FIG. 1, a host 1, a memory device 2, and a power supply regulator 3 are provided in this system. A decoupling capacitor C is connected between power supply voltage VCC and ground voltage GND of the power supply regulator 3. The host 1 can write and read data into and from the memory device 2. The memory device 2 can store data according to a request from the host 1. A controller 2A and NAND memories N1 to N4 are provided in the memory device 2. The controller 2A can perform drive control for the NAND memories N1 to N4. For example, the controller 2A can perform read/write control, block selection, error correction, wear leveling, and the like for the NAND memories N1 to N4. The power supply regulator 3 can generate the power supply voltage VCC to supply to the memory device 2. The memory device 2 may be incorporated in a memory card such as an SD card, or a memory module such as an eMMC™ or SSD (Solid State Drive), or a memory module compliant with UFS (Universal Flash Storage) standard. The system having the memory device 2 incorporated therein may be a mobile phone or a smart phone, or a personal computer or a server computer, or an audiovisual device such as a digital video camera, or a device mounted in a vehicle such as a car navigation system. The decoupling capacitor C can absorb voltage variation associated with variation in the power consumption of the memory device 2.

Although in FIG. 1 a VCC system is taken as an example of the power supply, the memory device 2 may be configured such that a for-I/O-power-supply VCCQ is supplied from another power supply or that the controller 2A and the NAND memories N1 to N4 operate with separate power supplies.

For each system in which the memory device 2 is incorporated, the current supply characteristic of the power supply regulator 3, the type, capacitance, number of decoupling capacitors C, and the characteristics of the printed-circuit board on which components are mounted are different. Further, there are variations in the characteristics of components mounted therein between individual products. When the current consumption and amount of variation therein of the memory device 2 increase, the operation may become unstable depending on the individual product because of such difference in the power-supply characteristic of the system, variations of individual products, and environmental factors such as the charge state of the battery incorporated in the product.

Figure 2:
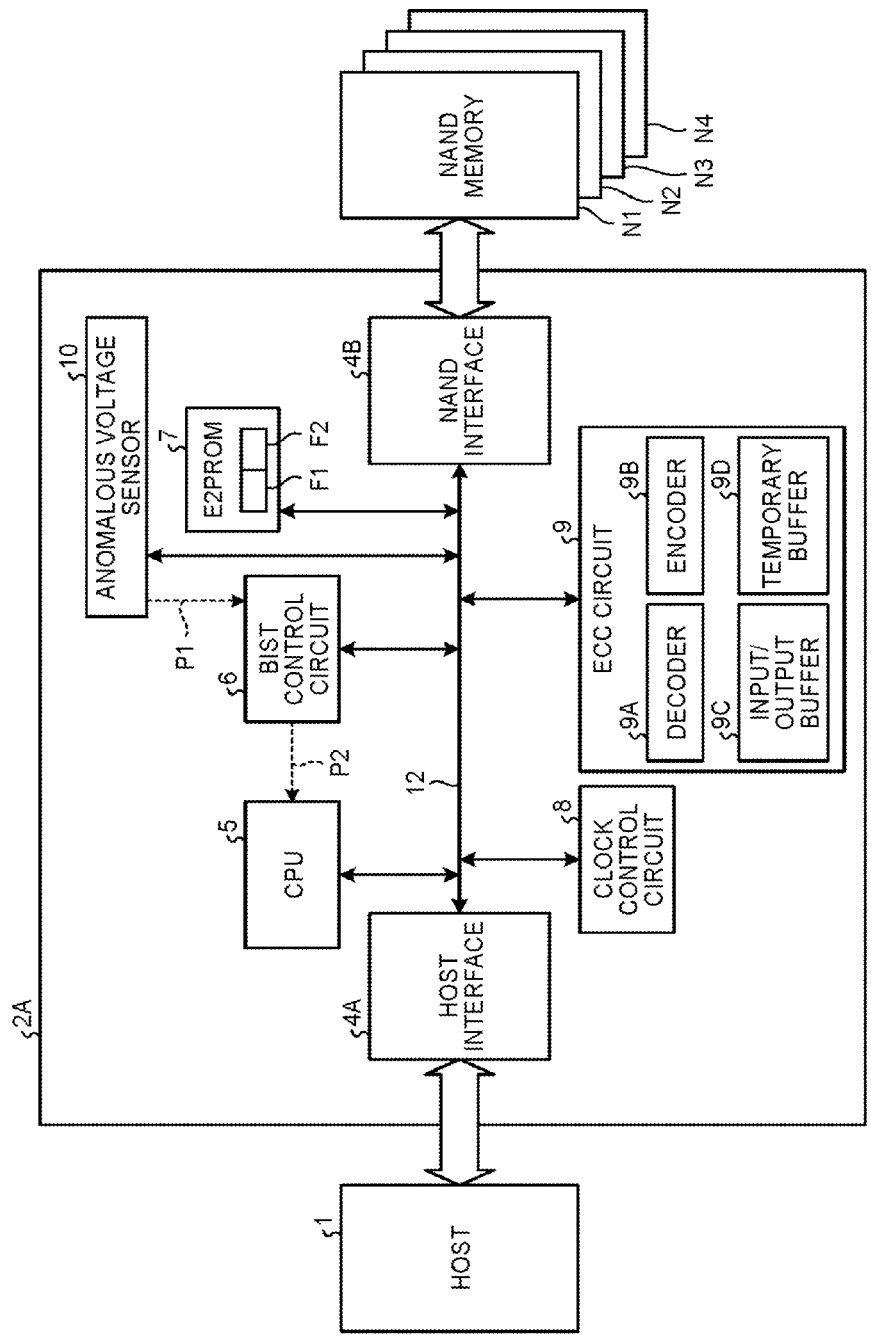
FIG. 2 is a block diagram showing schematically the configuration of a controller which is applied to the semiconductor device according to the first embodiment.

FIG. 2 is a block diagram showing schematically the configuration of the controller which is applied to the semiconductor device according to the first embodiment.

In FIG. 2, in the controller 2A, there are provided a host interface 4A, a NAND interface 4B, a CPU 5, a BIST control circuit 6, an E2PROM 7, a clock control circuit 8, an ECC circuit 9, and an anomalous voltage sensor 10. The host interface 4A, NAND interface 4B, CPU 5, BIST control circuit 6, E2PROM 7, clock control circuit 8, ECC circuit 9, and anomalous voltage sensor 10 are connected via a bus 12. The bus 12 may be divided into a number of sections or have a hierarchy. In the ECC circuit 9, there are provided a decoder 9A, an encoder 9B, an input/output buffer 9C, and a temporary buffer 9D. The host interface 4A mediates in data transfer with the host 1. The NAND interface 4B mediates in data transfer with the NAND memories N1 to N4. The CPU 5 controls the operations of the components of the controller 2A comprehensively. The BIST control circuit 6 performs BIST control of the components of the controller 2A. The E2PROM 7 stores a flag F indicating the success or failure of a BIST. The E2PROM 7 may be inside or outside the controller 2A, or an area of the NAND memories N1 to N4 may be used as the E2PROM 7. The clock control circuit 8 controls the clock frequency for each component of the controller 2A. The ECC circuit 9 performs error correction on data written in the NAND memories N1 to N4 and, if there is a parity error, performs error correction. The encoder 9B adds parity to data to be written into the NAND memories N1 to N4. The decoder 9A performs a parity check on data read from the NAND memories N1 to N4. The input/output buffer 9C holds input/output data for the ECC circuit 9. The temporary buffer 9D temporarily holds data to be corrected. The anomalous voltage sensor 10 detects the voltage in use by the controller 2A. The voltage in use by the controller 2A may be a power supply voltage supplied from outside the controller, or a power supply voltage inside the controller which is generated by one or more power supply generators in the controller.

The BIST control circuit 6 is put in one of two or more types of BIST modes different in the operation current of the controller 2A, so that the operation frequency and the like are set according to the BIST mode and that a BIST pattern corresponding to the BIST mode is generated. The controller 2A is made to operate based on the BIST pattern, at which time the voltage is detected by the anomalous voltage sensor 10. Then in the BIST control circuit 6, a flag F1 indicating the success of the BIST or a flag F2 indicating the failure of the BIST depending on the operation current of the controller 2A is created based on the detecting result of the anomalous voltage sensor 10 and stored into the E2PROM 7. At this time, the voltage detected by the anomalous voltage sensor 10 is at or below a threshold, a power supply failing P1 is notified to the BIST control circuit 6. This threshold may be a fixed value or a variable value, e.g., set in a register. When a power supply failing P1 is notified to the BIST control circuit 6, a flag F2 indicating the failure of the BIST is created. If a power supply failing P1 is not notified to the BIST control circuit 6, a flag F1 indicating the success of the BIST is created. When the flag F1 indicating the success of the BIST or the flag F2 indicating the failure of the BIST corresponding to a minimum operation current is created, an interrupt signal P2 for BIST completion is sent from the BIST control circuit 6 to the CPU 5, and thus the BIST finishes.

Then the CPU 5 reads the flag F1 from the E2PROM 7 at power-on and has the controller 2A operate in a current mode according to the operation current designated by the flag F1. At this time, the CPU 5 can control the clock frequency or configuration for each component of the controller 2A to correspond to the current mode according to the operation current designated by the flag F1. An example of the configuration of the controller 2A may be parallelism of ECC decoders.

Thus, even if the throughput and load of error correction of the controller 2A increase, an excessive load can be prevented from being imposed on the power supply regulator 3. Hence, the occurrence of a malfunction in the controller 2A and the destruction of data in the NAND memories N1 to N4 can be prevented, and thus the operation of the memory device 2 can be guaranteed.

Figure 3:
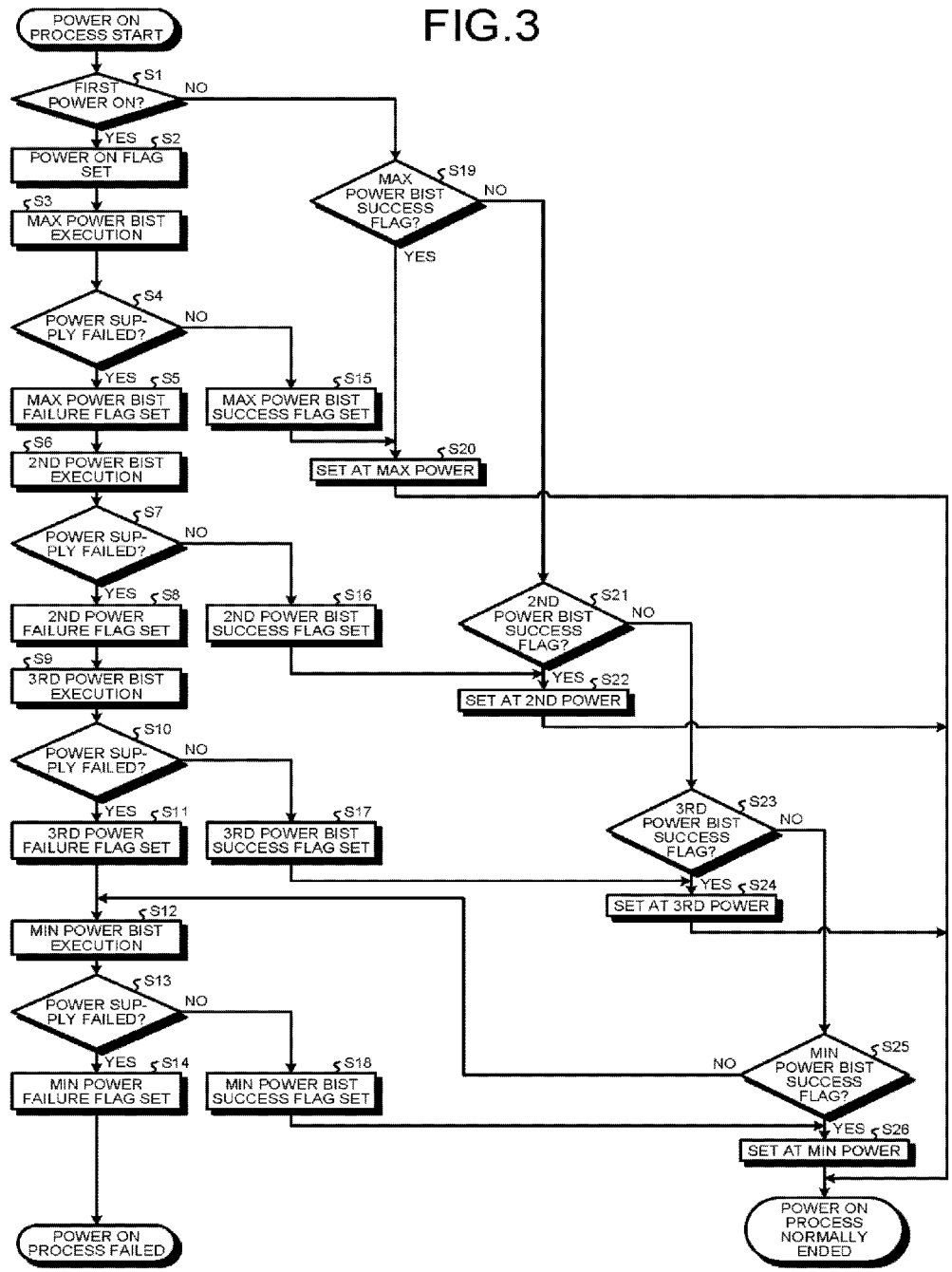
FIG. 3 is a flow chart showing the current consumption setting operation of the controller which is applied to the semiconductor device according to the first embodiment.

FIG. 3 is a flow chart showing the current consumption setting operation of the controller which is applied to the semiconductor device according to the first embodiment. Although the example of FIG. 3 shows the case where the operation current can be changed among four levels, the invention may be applied to the case where the operation current can be changed among N number of levels, where N is a positive integer.

In FIG. 3, when the memory device 2 is powered on, the controller determines whether this is the first power-on (S1). Then if it is the first power-on, after a power-on flag is set (S2), the BIST control circuit 6 performs the BIST with the largest operation current (S3). Then the operation voltage of the memory device 2 at this time is detected by the anomalous voltage sensor 10, and it is determined whether the operation voltage is at or below a threshold (S4). Then if the operation voltage at the largest operation current is at or below the threshold, it is determined that the power supply has failed. If it is determined that the power supply has failed, a largest-current BIST failure flag is set (S5), and the BIST control circuit 6 performs the BIST with the second largest operation current (S6). Then, the operation voltage of the memory device 2 at this time is detected by the anomalous voltage sensor 10, and it is determined whether the operation voltage is at or below the threshold (S7). Then if the operation voltage at the second largest operation current is at or below the threshold, it is determined that the power supply has failed. If it is determined that the power supply has failed, a second-current BIST failure flag is set (S8), and the BIST control circuit 6 performs the BIST with the third largest operation current (S9). Then the operation voltage of the memory device 2 at this time is detected by the anomalous voltage sensor 10, and it is determined whether the operation voltage is at or below the threshold (S10). Then if the operation voltage at the third largest operation current is at or below the threshold, it is determined that the power supply has failed. If it is determined that the power supply has failed, a third-current BIST failure flag is set (S11), and the BIST control circuit 6 performs the BIST with the smallest operation current (S12). Then the operation voltage of the memory device 2 at this time is detected by the anomalous voltage sensor 10, and it is determined whether the operation voltage is at or below the threshold (S13). Then if the operation voltage at the smallest operation current is at or below the threshold, it is determined that the power supply has failed. If it is determined that the power supply has failed, a smallest-current BIST failure flag is set (S14).

On the other hand, if it is determined that the power supply has not failed at S4, a largest-current BIST success flag is set (S15). If it is determined that the power supply has not failed at S7, a second-current BIST success flag is set (S16). If it is determined that the power supply has not failed at S10, a third-current BIST success flag is set (S17). If it is determined that the power supply has not failed at S13, a smallest-current BIST success flag is set (S18).

In contrast, if it is determined that this is the second or later power-on at S1, it is determined whether the largest-current BIST success flag is set (S19). Then if the largest-current BIST success flag is set, the current mode is set such that the memory device 2 operates with the largest current consumption (S20). If the largest-current BIST success flag is not set at S19, it is determined whether the second-current BIST success flag is set (S21). Then if the second-current BIST success flag is set, the current mode is set such that the memory device 2 operates with the second largest current consumption (S22). If the second-current BIST success flag is not set at S21, it is determined whether the third-current BIST success flag is set (S23). Then if the third-current BIST success flag is set, the current mode is set such that the memory device 2 operates with the third largest current consumption (S24). If the third-current BIST success flag is not set at S23, it is determined whether the smallest-current BIST success flag is set (S25). Then if the smallest-current BIST success flag is set, the current mode is set such that the memory device 2 operates with the smallest current consumption (S26).

In the case where the operation current can be changed among N number of levels, the Nth BIST is performed on the memory device 2 made to transition to the current mode where current consumption is lower than in the N−1'th BIST for N=1, 2, . . . until the Nth-current BIST success flag is set.

If, when the BIST is performed with the smallest operation current, it is determined that the power supply has failed, then at the next power-on, after the BIST is performed with the smallest operation current, the current mode may be set such that the memory device 2 operates with the smallest current consumption, or, at the next power-on, the current mode may be set such that the memory device 2 operates with the smallest current consumption without performing the BIST. Note that the reason why the determination is performed based on not the BIST failure flag but the BIST success flag in this embodiment is that, if a drop in voltage when the BIST is performed is too large, the BIST failure flag may not be able to be set.

Thus, with the controller 2A being incorporated in the product, the BIST can be repeated while current consumption is being changed until the BIST succeeds. Hence, the operation current mode in which the controller 2A stably operates as part of the product can be found, and the operation of the product having the controller 2A incorporated can be guaranteed.

If, at the second or later power-on, the largest-current BIST success flag is set, the controller 2A can be made to operate at the maximum frequency, so that the loss of the top performance can be prevented, and if the largest-current BIST success flag is not set, the operation of the controller 2A can be guaranteed suppressing the loss of the performance of the controller 2A to a minimum.

In the above embodiment, the method has been described which, if the operation voltage detected by the anomalous voltage sensor 10 is at or below a threshold, determines that the power supply has failed and which, if the operation voltage detected by the anomalous voltage sensor 10 exceeds the threshold, determines that the power supply has not failed. Here, the BIST control circuit 6 can check the results of testing while making the controller 2A operate based on a BIST pattern against expected values. Then if the operation voltage detected by the anomalous voltage sensor 10 is at or below a threshold, or if the testing results do not match the expected values, it may be determined that the power supply has failed, and if the operation voltage detected by the anomalous voltage sensor 10 exceeds the threshold, and if the testing results match the expected values, it may be determined that the power supply has not failed.

Second Embodiment

Figure 4:
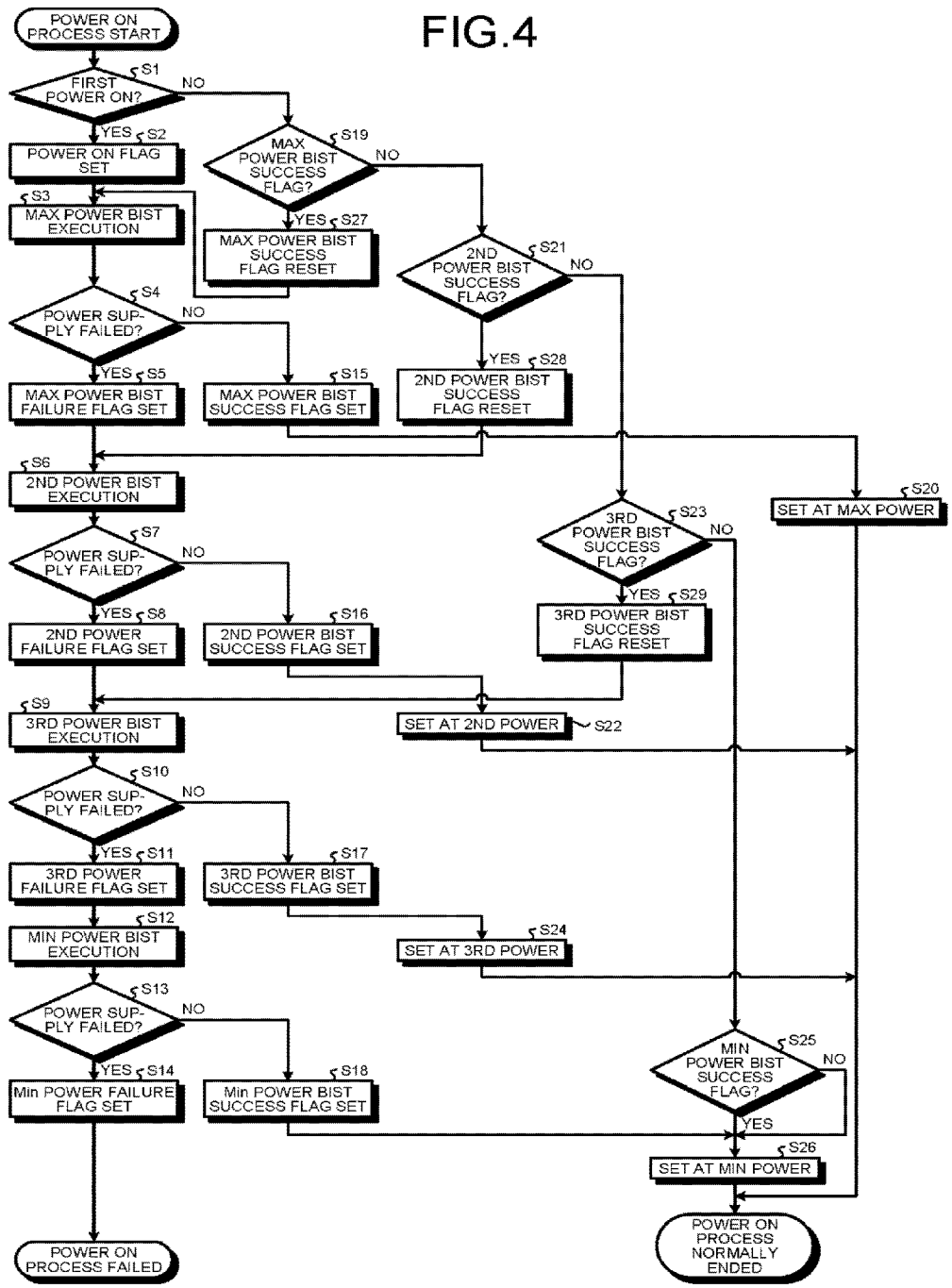
FIG. 4 is a flow chart showing the current consumption setting operation of a controller which is applied to a semiconductor device according to a second embodiment.

FIG. 4 is a flow chart showing the current consumption setting operation of a controller which is applied to a semiconductor device according to the second embodiment.

In FIG. 4, in this embodiment, the process of S27 to S29 is added to the process of FIG. 3. If the largest-current BIST success flag is set (S19), after the largest-current BIST success flag is reset (S27), the BIST control circuit 6 performs the BIST with the largest operation current (S3). If the second-current BIST success flag is set (S21), after the second-current BIST success flag is reset (S28), the BIST control circuit 6 performs the BIST with the second largest operation current (S6). If the third-current BIST success flag is set (S23), after the third-current BIST success flag is reset (S29), the BIST control circuit 6 performs the BIST with the third largest operation current (S9).

As such, by performing the BIST with the operation current that was successful the preceding time again at the second or later power-on, the operation stability of the memory device 2 can be guaranteed even if the performance of the memory device 2 has decreased due to the over-time change of the memory device 2 or change in operation environment.

Third Embodiment

Figure 5:
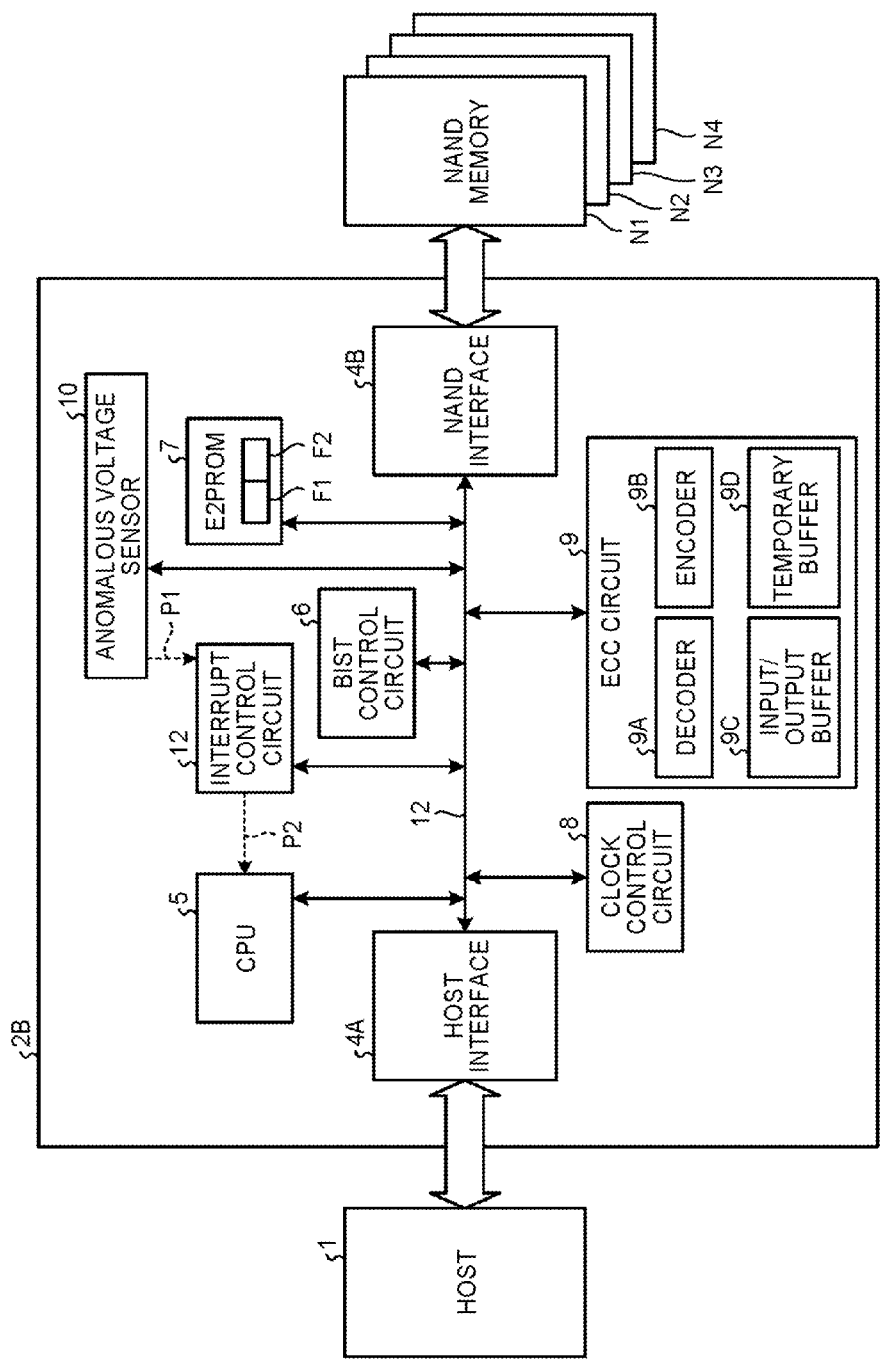
FIG. 5 is a block diagram showing schematically the configuration of a controller which is applied to a semiconductor device according to a third embodiment.

FIG. 5 is a block diagram showing schematically the configuration of a controller which is applied to a semiconductor device according to the third embodiment.

In FIG. 5, in the memory device 2, there is provided a controller 2B instead of the controller 2A. In the controller 2B, an interrupt control circuit 12 is added to the controller 2A. If the voltage detected by the anomalous voltage sensor 10 is at or below a threshold, a power supply failing P1 is notified to the interrupt control circuit 12. Then the interrupt control circuit 12 creates an interrupt signal P2 for BIST completion based on the power supply failing P1 to send to the CPU 5.

Making the interrupt control circuit 12 execute the processing of an interruption to the CPU 5 results in the BIST control circuit 6 not needing to execute the interruption processing, and thus the load on the BIST control circuit 6 can be reduced.

Fourth Embodiment

Figure 6:
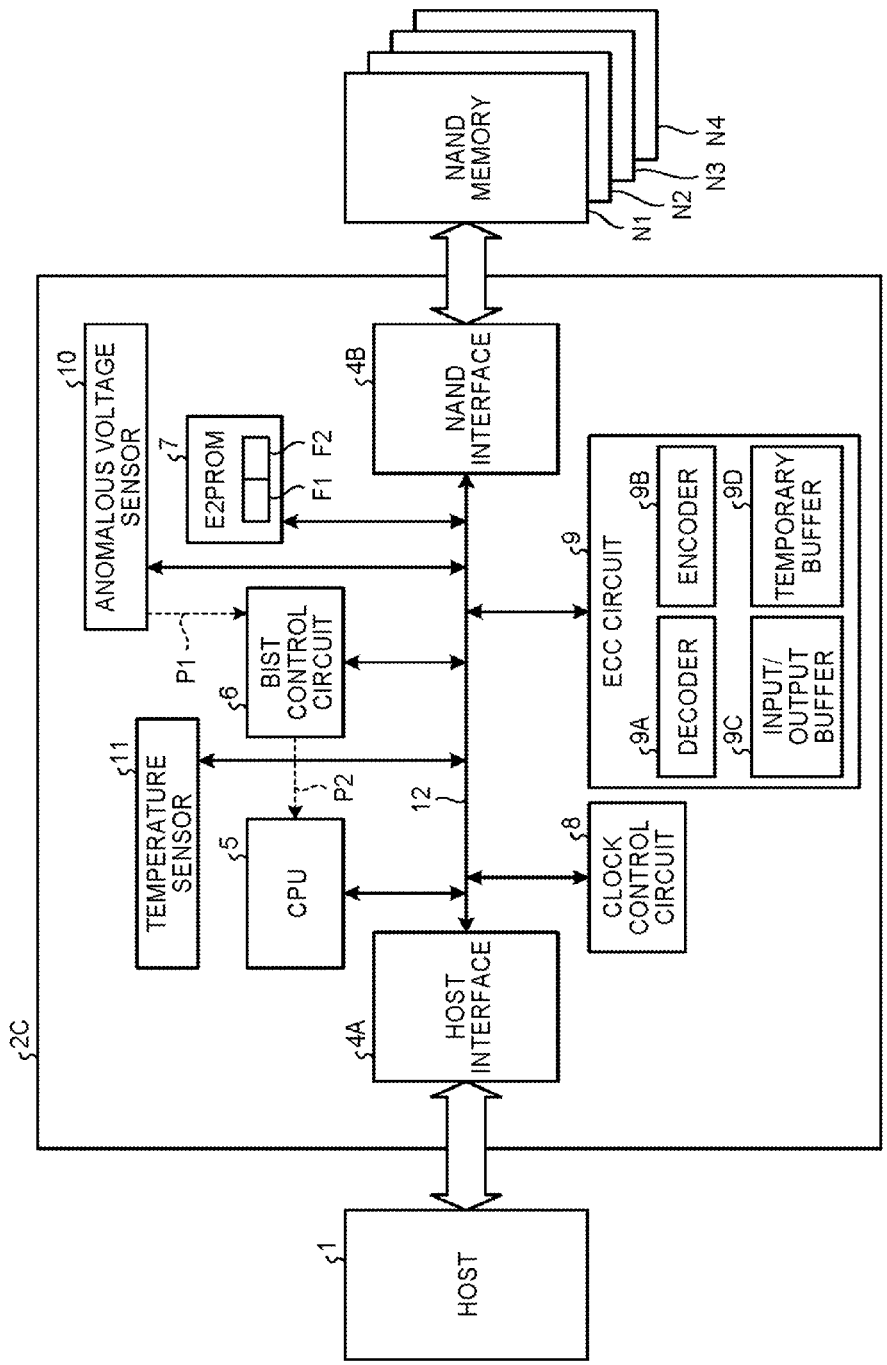
FIG. 6 is a block diagram showing schematically the configuration of a controller which is applied to a semiconductor device according to a fourth embodiment.

FIG. 6 is a block diagram showing schematically the configuration of a controller which is applied to a semiconductor device according to the fourth embodiment.

In FIG. 6, in the memory device 2, there is provided a controller 2C instead of the controller 2A. In the controller 2C, a temperature sensor 11 is added to the controller 2A. In FIG. 6 of this embodiment, the temperature sensor 11 can detect the temperature of the controller 2C. The temperature sensor 11 is connected to the internal bus 12. The temperature sensor 11 may be placed outside the controller 2C and connected to the controller 2C via an external bus (not shown), or may read the value of a temperature sensor incorporated in the NAND memories N1 to N4 or the like. Where the temperature sensor 11 is placed outside the controller 2C, the temperature of the controller 2C to be detected may be a temperature of the ambient environment of the controller 2C, a temperature of a printed-circuit board on which the controller 2C is mounted, a temperature of an IC chip in which the controller 2C is mounted, or a temperature of a NAND memory placed near the controller 2C. The BIST control circuit 6 adjusts the threshold to be compared with the voltage detected by the anomalous voltage sensor 10 to determine whether the BIST has succeeded or failed, based on the detecting result of the temperature sensor 11. As to CMOS transistors, as the temperature decreases, the switching current increases. Accordingly, when the temperature is low, the operation at the low temperature can be guaranteed by decreasing the threshold as compared with when the temperature is high, and when the temperature is high, the operation at the low temperature can be guaranteed by increasing the threshold as compared with when the temperature is low.

Figure 7:
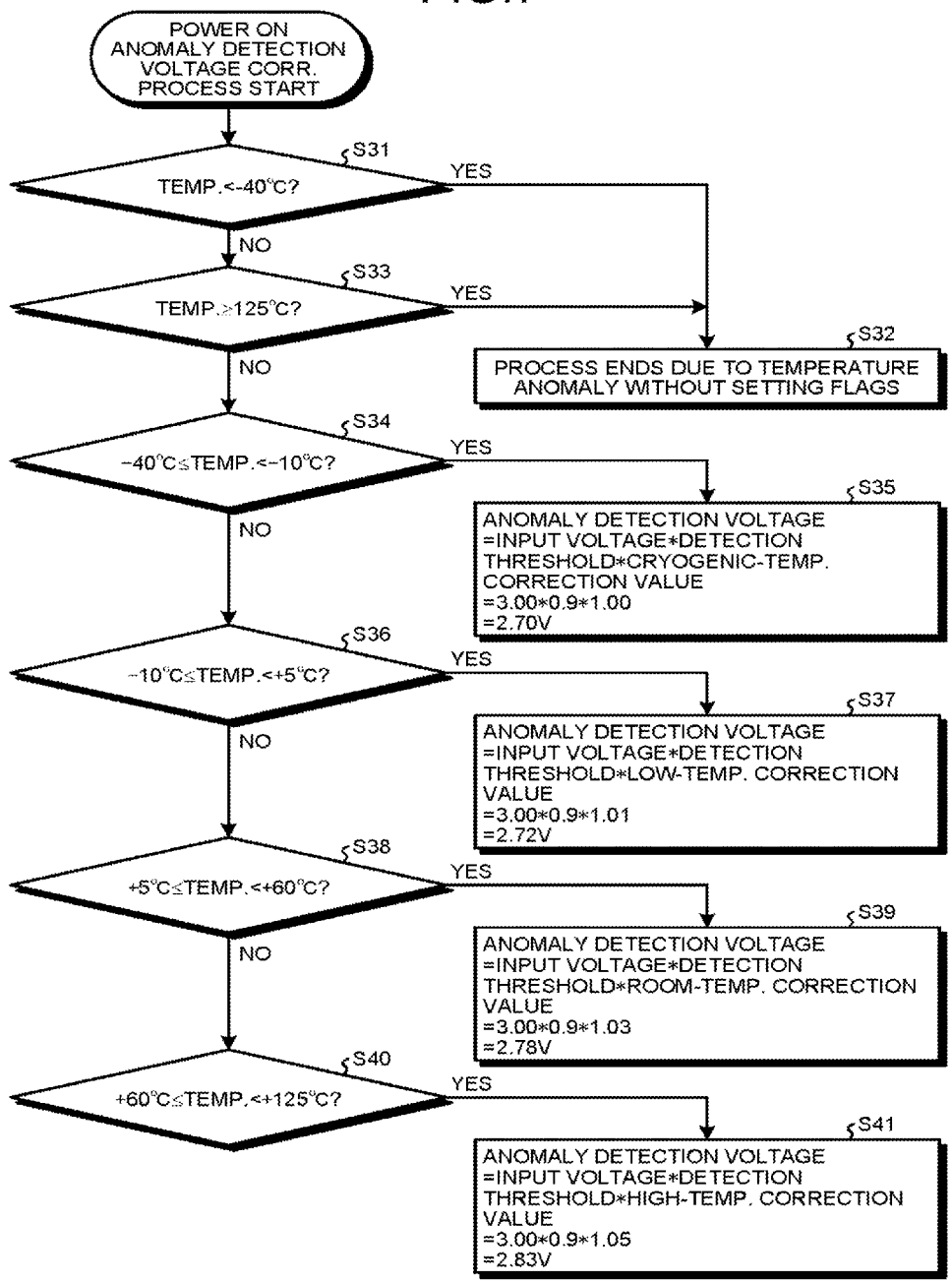
FIG. 7 is a flow chart showing an excerpt from the current consumption setting operation of the controller which is applied to the semiconductor device according to the fourth embodiment.

FIG. 7 is a flow chart showing an excerpt from the current consumption setting operation of the controller which is applied to a semiconductor device according to the fourth embodiment.

In FIG. 7, letting "an anomaly detection voltage" be the threshold after correction for temperature with which to determine whether the BIST has succeeded or failed and a detection threshold be a coefficient with which to calculate the anomaly detection voltage before correction for temperature, the anomaly detection voltage can be expressed as the anomaly detection voltage=an input voltage×the detection threshold×a temperature correction value. In the example of FIG. 7, with the input voltage=3.0 V and the detection threshold=0.9, the temperature correction values are as follows: a cryogenic-temperature correction value=1.00, a low-temperature correction value=1.01, a room-temperature correction value=1.03, and a high-temperature correction value=1.05. Further, suppose that the operation temperature range of an ASIC is junction temperatures inside the ASIC that are observed by temperature sensors inside the ASIC, from −40° C. to 125° C. Yet further, the anomaly detection voltage can be set in units of 0.01 V, and the voltage value after correction is obtained by rounding the calculated value down to significant digits.

If the temperature is below −40° C. or at or above 125° C. (S31, S33), it is determined that the power supply has failed before the BIST is executed. At this time, not the BIST execution flag nor the BIST success flag is set (S32).

If the temperature is at or above −40° C. and below −10° C. (S34), the anomaly detection voltage is not corrected for the temperature (S35). At this time, the anomaly detection voltage is 2.70 V, 90% of the input voltage of 3.00 V.

If the temperature is at or above −10° C. and below +5° C. (S36), the anomaly detection voltage after temperature correction is a value obtained by correcting the anomaly detection voltage before temperature correction with the low-temperature correction value of 101% (S37). At this time, the anomaly detection voltage after temperature correction is 2.72 V, 90.9% of the input voltage of 3.00 V.

If the temperature is at or above +5° C. and below +60° C. (S38), the anomaly detection voltage after temperature correction is a value obtained by correcting the anomaly detection voltage before temperature correction with the room-temperature correction value of 103% (S39). At this time, the anomaly detection voltage after temperature correction is 2.78 V, 92.7% of the input voltage of 3.00 V.

If the temperature is at or above +60° C. and below +125° C. (S40), the anomaly detection voltage after temperature correction is a value obtained by correcting the anomaly detection voltage before temperature correction with the high-temperature correction value of 105% (S41). At this time, the anomaly detection voltage after temperature correction is 2.83 V, 94.5% of the input voltage of 3.00 V.

Then in the process of FIG. 7, after the anomaly detection voltage is corrected for temperature, the process of FIG. 3 or 4 is executed, thereby setting the current mode of the controller 2C. Although the method which multiplies it by the correction value corresponding to the temperature range is shown in the above embodiment, it may be corrected with a function of temperature.

Fifth Embodiment

Figure 8:
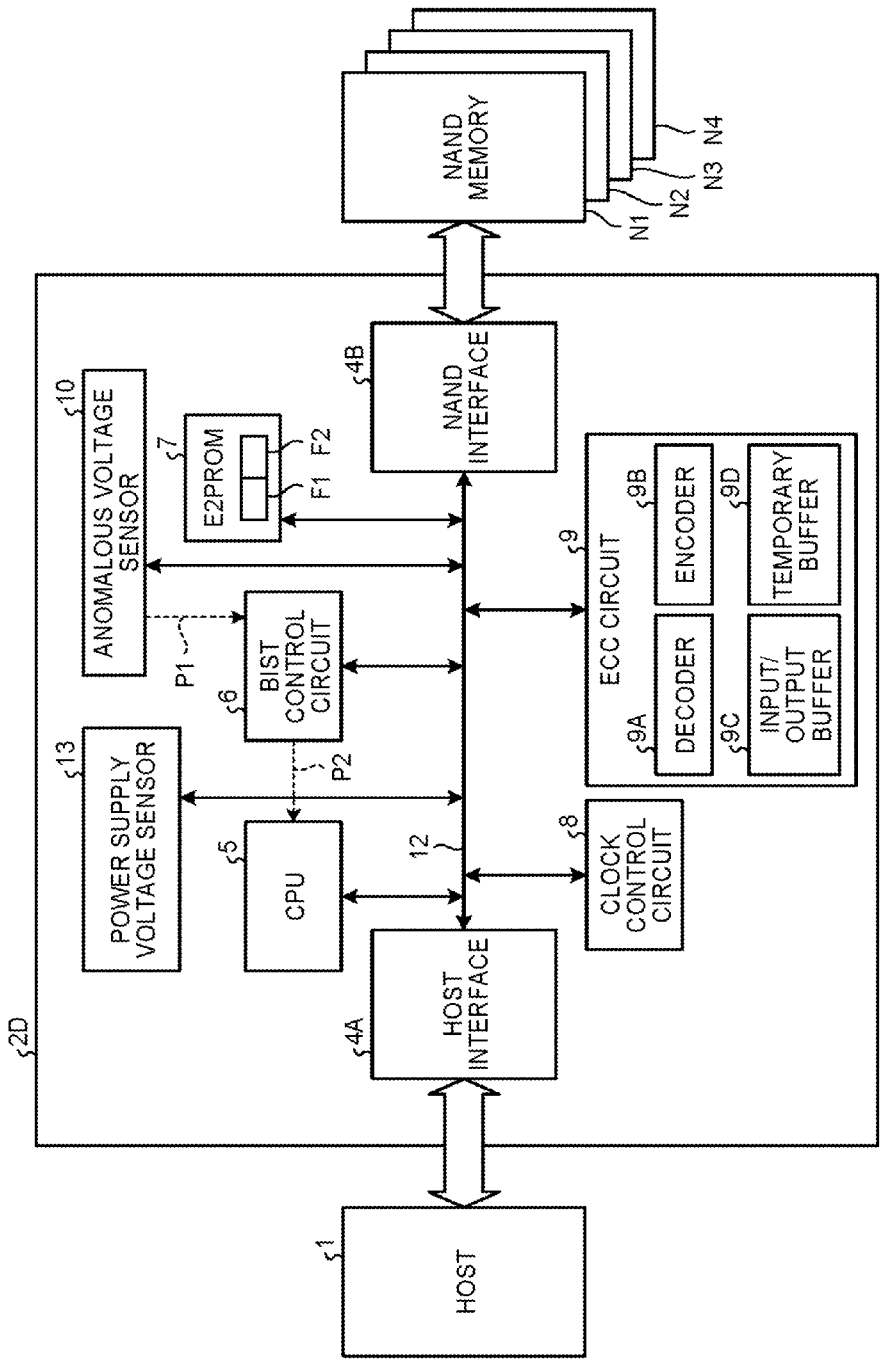
FIG. 8 is a block diagram showing schematically the configuration of a controller which is applied to a semiconductor device according to a fifth embodiment.

FIG. 8 is a block diagram showing schematically the configuration of a controller which is applied to a semiconductor device according to the fifth embodiment.

In FIG. 8, in the memory device 2, there is provided a controller 2D instead of the controller 2A. In the controller 2D, a power supply voltage sensor 13 is added to the controller 2A. The power supply voltage sensor 13 can detect the power supply voltage of the controller 2D. The power supply voltage sensor 13 is connected to the bus 12. The BIST control circuit 6 adjusts the threshold to be compared with the voltage detected by the anomalous voltage sensor 10 to determine whether the BIST has succeeded or failed, based on the detecting result of the power supply voltage sensor 13. As to CMOS transistors, as the power supply voltage increases, the switching current increases. Accordingly, when the power supply voltage is high, the operation at the high power supply voltage can be guaranteed by decreasing the threshold as compared with when the power supply voltage is low. The power supply voltage sensor 13 may be integrated with the anomalous voltage sensor 10.

Figure 9:
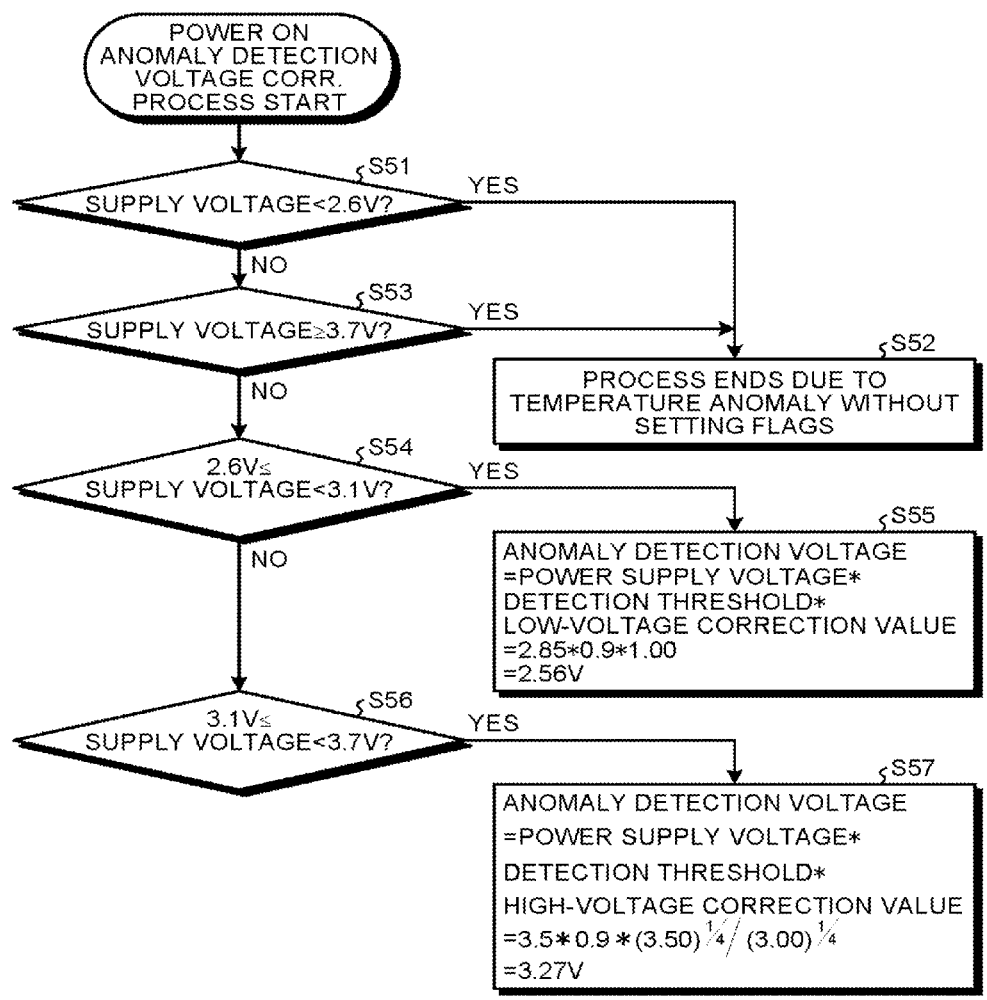
FIG. 9 is a flow chart showing an excerpt from the current consumption setting operation of the controller which is applied to the semiconductor device according to the fifth embodiment.

FIG. 9 is a flow chart showing an excerpt from the current consumption setting operation of the controller which is applied to the semiconductor device according to the fifth embodiment.

In FIG. 9, letting "an anomaly detection voltage" be the threshold after correction for voltage with which to determine whether the BIST has succeeded or failed and a detection threshold be a coefficient with which to calculate the anomaly detection voltage before correction for voltage, the anomaly detection voltage can be expressed as the anomaly detection voltage=the power supply voltage×the detection threshold×a voltage correction value. In the example of FIG. 9, with a standard voltage=3.0 V and the detection threshold=0.9, the voltage correction values are as follows: a low-voltage correction value=1.00 and a high-voltage correction value=(the power supply voltage)$^{1/4}$/(the standard voltage)$^{1/4}$.

If the power supply voltage is below 2.6 V or at or above 3.7 V (S51, S53), it is determined that the power supply has failed before the BIST is executed. At this time, not the BIST execution flag nor the BIST success flag is set (S52).

If the power supply voltage is at or above 2.6 V and below 3.1 V (S54), the anomaly detection voltage is not corrected for the voltage (S55). For example, if the power supply voltage is 2.85 V, the anomaly detection voltage after voltage correction is set at the power supply voltage (2.85 V)×the detection threshold (0.9)×the voltage correction value (1.00)=2.56 V.

If the power supply voltage is at or above 3.1 V and below 3.7 V (S56), it is multiplied by the high-voltage correction value, (the power supply voltage)$^{1/4}$/(the standard voltage)$^{1/4}$ (S57). For example, if the power supply voltage is 3.5 V, the anomaly detection voltage after voltage correction is set at the power supply voltage (3.5)×the detection threshold (0.9)×(3.50)$^{1/4}$/(3.00)$^{1/4}$=3.27 V.

Then in the process of FIG. 9, after the anomaly detection voltage is corrected for voltage, the process of FIG. 3 or 4 is executed, thereby setting the current mode of the controller 2D. Although the method which corrects with a function of voltage is shown in the above embodiment, it may be multiplied by a correction value corresponding to the voltage range.

Sixth Embodiment

Figure 10:
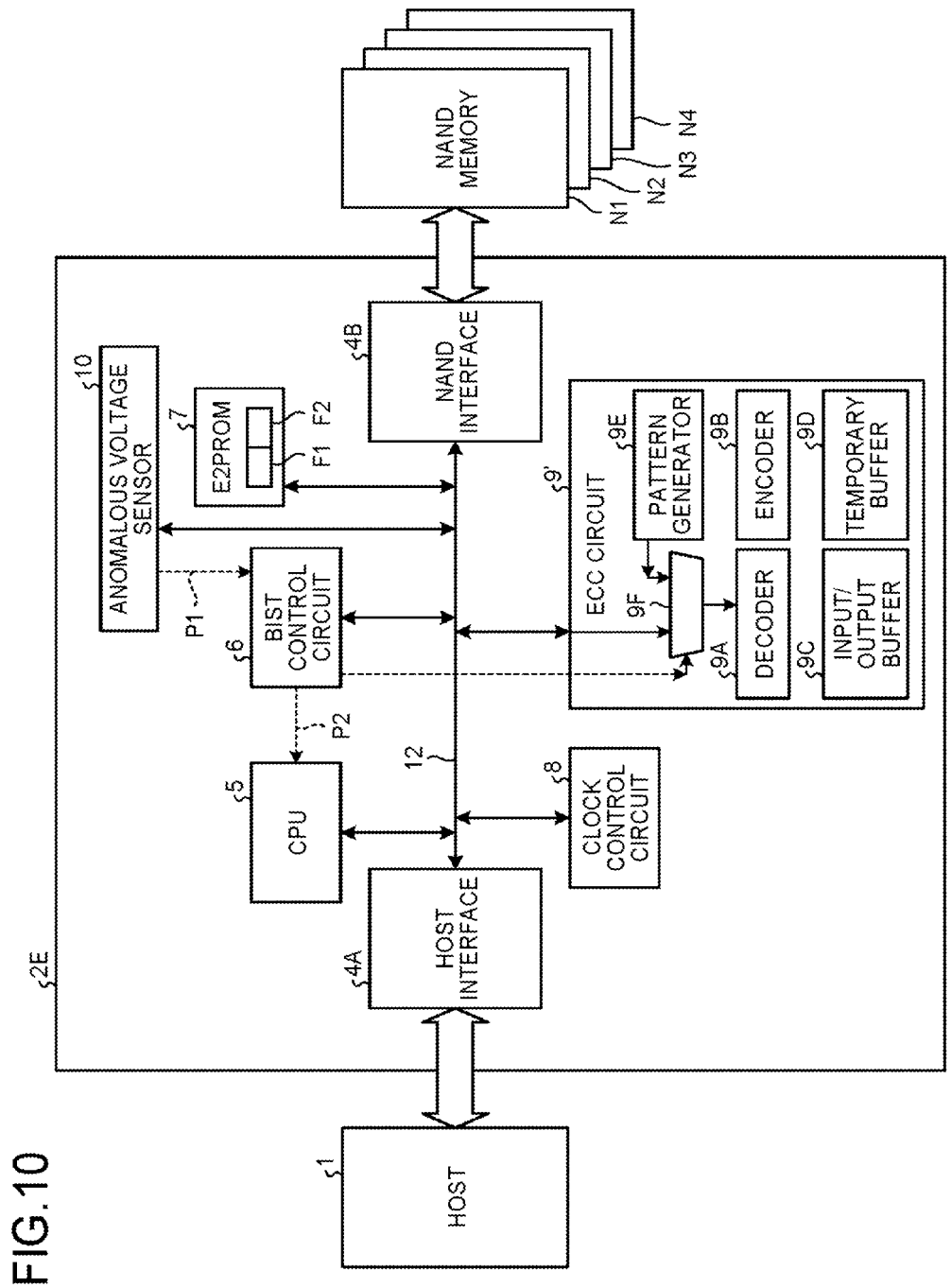
FIG. 10 is a block diagram showing schematically the configuration of a controller which is applied to a semiconductor device according to a sixth embodiment.

FIG. 10 is a block diagram showing schematically the configuration of a controller which is applied to a semiconductor device according to the sixth embodiment.

In FIG. 10, in the memory device 2, there is provided a controller 2E instead of the controller 2A. In the controller 2E, an ECC circuit 9' is provided instead of the ECC circuit 9. In the ECC circuit 9', a pattern generator 9E and a selector 9F are added to the ECC circuit 9. The pattern generator 9E can generate a BIST pattern with which the operation current of the decoder 9A is largest. The selector 9F can switch the input to the decoder 9A between data from the NAND interface 4B and a BIST pattern generated by the pattern generator 9E.

If the BIST control circuit 6 performs the BIST with the largest operation current, the BIST pattern generated by the pattern generator 9E is inputted to the decoder 9A. Then the BIST control circuit 6 has the anomalous voltage sensor 10 detect the operation voltage of the memory device 2 at this time and determines whether the operation voltage is at or below a threshold, thereby determining whether the power supply has failed. At this time, if the decoder 9A is operating with the largest operation current, the power consumption of the decoder 9A is the largest in the memory device 2. Hence, by selecting a BIST pattern such that the decoder 9A operates with the largest operation current, the memory device 2 can be caused to operate with the largest operation current, so that accuracy in determining whether the power supply has failed at this time can be improved.

The BIST pattern with which the operation current of the decoder 9A is largest will be described below.

In order to improve an activation rate, test patterns generated by an ATPG (Automatic Test Pattern Generator) are often used in the BIST. In this case, the ECC circuit 9' that is large in power consumption in the controller 2E tends to increase in power consumption as the number of error corrections increases, but when the number of corrections is too large, the time for error correction also increases, and thus the throughput of the memory device 2 decreases, so that the power consumption may decrease. Especially where the size of data to be handled by the ECC circuit 9' is large as in a NAND controller or the like, data processing is complex, and it is difficult to simply generate random patterns and to search for a pattern with which the power consumption is largest. Hence, the probability is low that a test pattern generated by the ATPG will cause the power consumption of the ECC circuit 9' to be largest.

Accordingly, presuming an input data pattern or an input error pattern with which the power consumption of the ECC circuit 9' is largest from the ECC circuit system, a simulation of RTL level or gate level should be performed to estimate the power consumption for the pattern so as to use as a BIST pattern. The ECC by which multiple bits can be corrected such as BCH Code (Bose-Chaudhuri-Hocquenghem Code) or LDPC Code (Low Density Parity-Check Code) has the following properties.

When the number of bits to be corrected is increased, the number of clock cycles required for correction processing tends to increase. When the number of error bits increases, in the BCH, the number of clock cycles required for the Chien search to search for the positions of bits to be corrected and the like increases. When the number of error bits increases, in the ECC of a maximum likelihood decoding system such as LDPC, the number of times of repeating the calculation of the degree of likelihood increases, so that the number of clock cycles required for correction tends to increase.

In the process of reading data from the NAND memories N1 to N4, if the correction processing time of the ECC circuit 9' is longer than other processing times such as the reading time of the NAND memories N1 to N4, the time of data input to the ECC circuit 9', and the time of data output from the ECC circuit 9', then the throughput of the entire data reading process including the ECC circuit 9' decreases, so that the current consumption of components other than the ECC circuit 9' decreases. In contrast, the power consumption of the ECC circuit 9' itself is almost constant during the read data correction processing. In the BIST, the reading time of the NAND memories N1 to N4 does not need to be taken into account, but, if a BIST is configured to test data input/output to the ECC circuit 9' and the ECC circuit 9' itself together, an error-contained data pattern with which the throughput of data correction in the ECC circuit 9' and the throughput of data input/output to the ECC circuit 9' almost coincide, can cause the power consumption to take on a relative maximum.

The input/output buffer 9C and the temporary buffer 9D become larger in power consumption as the number of bits increases which are inverted between data inputted to the ECC circuit 9' in a processing cycle and data inputted to the ECC circuit 9' in a processing cycle immediately before the ECC. Especially, when an input data pattern close to being all at 0, on a bit basis, having errors inserted and an input data pattern close to being all at 1 having errors inserted are alternately inputted to the ECC circuit 9', the switching probability of the ECC circuit 9' including the input/output buffer 9C and the temporary buffer 9D becomes higher, so that the entire ECC circuit 9' is activated.

As such, when an input data pattern close to being all at 0 having a number of errors inserted, for which ECC correction takes almost the same processing time as data input, and an input data pattern close to being all at 1 having a number of errors inserted, for which ECC correction takes almost the same processing time as data input, are alternately inputted, the power consumption of the entire ECC circuit 9' including its peripheral circuit can be caused to take on a relative maximum. By preparing a BIST pattern including patterns to be alternately executed which have, e.g., all-at-0 data and all-at-1 data as bases and into which a number of errors, ECC-correctable, are mixed, the largest current consumption can be made to occur.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
an integrated circuit having a plurality of current modes different in operation current;
a voltage sensor that detects a voltage in use by the integrated circuit;
a built-in self test (BIST) control circuit that generates BIST patterns different in the operation current and creates a flag indicating the success or failure of a BIST corresponding to the operation current based on the result of detecting the voltage while the integrated circuit operates based on the BIST pattern; and
a storing circuit that stores the flag,
wherein the integrated circuit sets the current mode based on the flag, and
wherein the BIST control circuit generates the BIST patterns in the order in which the operation current becomes smaller, and if the BIST has succeeded with a BIST pattern having the Nth largest operation current, where N is a positive integer, stores a flag indicating the success of a BIST in the Nth current mode into the storing unit.

2. The semiconductor device of claim 1, wherein at power-on, the integrated circuit reads the flag indicating the success of the BIST in the Nth current mode and sets the current mode to be the Nth current mode.

3. The semiconductor device of claim 1,
wherein at power-on, the integrated circuit reads the flag indicating the success of the BIST in the Nth current mode, and
wherein after resetting the flag indicating the success of the BIST in the Nth current mode, the BIST control circuit creates the flag indicating the success or failure of the BIST again based on the BIST pattern having the Nth or later operation current.

4. The semiconductor device of claim 1, comprising a temperature sensor that detects a temperature of the integrated circuit,
wherein the BIST control circuit corrects a threshold of the voltage indicating the success or failure of the BIST based on a result of detecting the temperature.

5. The semiconductor device of claim 1, comprising a power supply sensor that detects a power supply voltage of the integrated circuit,
wherein the BIST control circuit corrects a threshold of the voltage indicating the success or failure of the BIST based on a result of detecting the power supply voltage.

6. The semiconductor device of claim 1, wherein the integrated circuit is a NAND controller.

7. The semiconductor device of claim 6,
wherein the NAND controller comprises an ECC circuit that corrects errors in data written in a NAND memory,
wherein the ECC circuit comprises a BIST pattern generator that generates a BIST pattern which causes the operation current of the ECC circuit to be largest, and
wherein the BIST control circuit creates a flag indicating the success or failure of the BIST based on the result of detecting the voltage while the ECC circuit is made to operate based on the BIST pattern.

8. The semiconductor device of claim 7, wherein the ECC circuit comprises:
an encoder that adds parity to data to be written into the NAND memory; and
a decoder that performs a parity check on data read from the NAND memory,
wherein the BIST pattern generator generates a BIST pattern which causes the operation current of the decoder to be largest, and
wherein the BIST control circuit creates a flag indicating the success or failure of the BIST based on the result of detecting the voltage while the decoder is made to operate based on the BIST pattern.

9. The semiconductor device of claim 6, wherein the NAND controller comprises:
a CPU;
a host interface that mediates in data transfer with a host;
a NAND interface that mediates in data transfer with a NAND memory; and
a clock control circuit that controls a clock frequency of the integrated circuit.

10. A current control method of a semiconductor device comprising:
generating BIST patterns different in the operation current of an integrated circuit;
detecting a voltage in use by the integrated circuit while the integrated circuit is made to operate based on the BIST pattern;
creating a flag indicating the success or failure of a BIST based on the result of detecting the voltage so as to be stored; and
setting a current mode of the integrated circuit based on the flag,
wherein, in the generating of the BIST patterns, the BIST patterns are generated in the order in which the operation current becomes smaller, and
wherein, in the creating of the flag, if the BIST has succeeded with a BIST pattern having the Nth largest operation current, where N is a positive integer, a flag indicating the success of a BIST in the Nth current mode is stored.

11. The current control method of claim 10, further comprising: at power-on, reading the flag indicating the success of the BIST in the Nth current mode and setting the current mode of the integrated circuit to be the Nth current mode.

12. The current control method of claim 10, further comprising: at power-on, reading the flag indicating the success of the BIST in the Nth current mode, and creating, after resetting the flag indicating the success of the BIST in the Nth current mode, the flag indicating the success or failure of the BIST again based on the BIST pattern having the Nth or later operation current.

13. The current control method of claim 10, further comprising: correcting a threshold of the voltage indicating the success or failure of the BIST based on a result of detecting a temperature of the integrated circuit.

14. The current control method of claim 10, further comprising: correcting a threshold of the voltage indicating the success or failure of the BIST based on a result of detecting a power supply voltage of the integrated circuit.

15. The current control method of claim 10, wherein the integrated circuit is a NAND controller.

16. The current control method of claim 15,
wherein the NAND controller comprises an ECC circuit that corrects errors in data written in a NAND memory, and
wherein the current control method further comprises:
creating a flag indicating the success or failure of the BIST based on the result of detecting the voltage while the ECC circuit is made to operate based on each of BIST patterns different in the operation current of the ECC circuit.

17. The current control method of claim 16, wherein the ECC circuit comprises:
   an encoder that adds parity to data to be written into the NAND memory; and
   a decoder that performs a parity check on data read from the NAND memory,
   wherein the current control method further comprises: creating BIST patterns different in the operation current of the decoder, and creating a flag indicating the success or failure of the BIST based on the result of detecting the voltage while the decoder is made to operate based on each of the BIST patterns.

18. The current control method of claim 15, wherein the NAND controller further controls a clock frequency of the integrated circuit, thereby setting the current mode of the integrated circuit.

* * * * *